(12) United States Patent
Yumoto et al.

(10) Patent No.: US 7,144,257 B2
(45) Date of Patent: Dec. 5, 2006

(54) MOUNTING STRUCTURE, ELECTRO-OPTICAL DEVICE, ELECTRONIC APPARATUS, AND METHOD OF MANUFACTURING ELECTRO-OPTICAL DEVICE

(75) Inventors: Masanori Yumoto, Suwa (JP); Chiaki Imaeda, Suwa (JP); Yoshihisa Hirano, Suwa (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 11/055,361

(22) Filed: Feb. 10, 2005

(65) Prior Publication Data

US 2005/0202694 A1    Sep. 15, 2005

(30) Foreign Application Priority Data

Feb. 10, 2004    (JP)    ............................. 2004-033476

(51) Int. Cl.
*H01R 12/00*    (2006.01)
(52) U.S. Cl. ....................................................... 439/67
(58) Field of Classification Search ................. 439/67, 439/77, 493, 531, 91, 66, 329, 68–73; 349/149–152, 349/58–62; 361/681–682, 398–412; 174/261–268
See application file for complete search history.

(56) References Cited

U.S. PATENT DOCUMENTS 5,047,895 A * 9/1991 Sasaki ........................ 361/749
5,358,412 A * 10/1994 Maurinus et al. ............. 439/66
6,191,838 B1 * 2/2001 Muramatsu .................. 349/149
6,342,932 B1 * 1/2002 Terao et al. .................. 349/58
6,444,923 B1 * 9/2002 Iriguchi et al. ............. 174/261
6,781,230 B1 * 8/2004 Tsukamoto .................. 257/700
6,814,582 B1 * 11/2004 Vadasz et al. ................ 439/61

FOREIGN PATENT DOCUMENTS

JP    2002-299773    10/2002

* cited by examiner

*Primary Examiner*—Truc T. Nguyen
*Assistant Examiner*—Edwin A. Leon
(74) *Attorney, Agent, or Firm*—Harness, Dickey & Pierce, P.L.C.

(57) ABSTRACT

An electro-optical device is provided wherein a plurality of electronic components is integrally mounted on a circuit board and the circuit board is then connected to an FPC board. In the FPC board, a protrusion portion extending in the length direction of the FPC board is formed, and terminals of the protrusion portion and terminals of the circuit board are connected to each other in a state where an end of the circuit board overlapping the surface of a main body of the FPC board enters the back surface side of the protrusion portion and thus the protrusion portion overlaps the circuit board, so that the circuit board is disposed to intersect the protrusion portion.

6 Claims, 6 Drawing Sheets

MOUNTING STRUCTURE, ELECTRO-OPTICAL DEVICE, ELECTRONIC APPARATUS, AND METHOD OF MANUFACTURING ELECTRO-OPTICAL DEVICE

RELATED APPLICATIONS

This application claims priority to Japanese Patent Application No. 2004-033476 filed Feb. 10, 2004 which is hereby expressly incorporated by reference herein in its entirety.

BACKGROUND

1. Technical Field

The present invention relates to a mounting structure, an electro-optical device in which a flexible printed circuit board (hereinafter, referred to as an FPC (Flexible Printed Circuit) board) is connected to an electro-optical device substrate, and an electronic apparatus comprising the electro-optical device.

2. Related Art

In electro-optical devices such as liquid crystal display devices, organic electroluminescence display devices, etc., pixels are arranged at positions corresponding to intersections between a plurality of data lines and a plurality of scanning lines, and the respective pixels are driven by supplying predetermined signals to the respective pixels through the data lines and the scanning lines. As a result, in the electro-optical devices, an FPC board is connected to an electro-optical device substrate, and various signals are input to the electro-optical device substrate through the FPC board.

Here, a structure that electronic components such as a power IC, a control IC, etc. are mounted on the FPC board has been suggested (for example, see Japanese Unexamined Patent Application Publication No. 2002-299773).

However, in the electro-optical device disclosed in Japanese Unexamined Patent Application Publication No. 2002-299773, since a plurality of electronic components must be mounted on the FPC board, there is a problem that the mounting step takes much time and thus the working efficiency is low. The electronic components are mounted at different positions on the FPC board. Accordingly, when the electro-optical device substrate to which the FPC board is connected is fitted into a case, spaces for disposing the plurality of electronic components must be distributed and secured at different positions of the case, so that there is also a problem that dead spaces are increased.

Therefore, the applicant of the present invention contrived, as shown in FIG. 6, a structure that a plurality of electronic components 5X is mounted on a circuit board 30X such as a glass-epoxy board and then the circuit board 30X is mounted to overlap an FPC board 20X. According to this structure, since it is possible to efficiently mount the plurality of electronic components 5X on the circuit board 30X using a reflow soldering method, the working efficiency is enhanced in the mounting step. In addition, since the electronic components 5X are integrated on the circuit board 30X, it is enough that spaces for disposing the plurality of electronic components 5X are collectively secured at a position where the circuit board 30X is received when an electro-optical panel 1OX is fitted into a case, and it is not necessary to secure the spaces for disposing the electronic components 5X at different positions in the case.

However, in a case where the electronic components 5X are mounted on the FPC board 20X using the circuit board 30X, when it is necessary to bend the FPC board 20X in the direction indicated by the arrow W, a narrow board should be used as the circuit board 30X, so that a longitudinal narrow board is used as the circuit board 30X. Further, it is necessary to arrange the circuit board 30X in the width direction of the FPC board 20X. Accordingly, in the area of the FPC board 20X overlapped with the circuit board 30X, it is necessary to arrange terminals for mounting the circuit board 30X in the width direction. Therefore, in the FPC board 20X, the wiring patterns should be arranged to avoid the area overlapped with the circuit board 30X, so that the degree of freedom in layout is damaged when designing the wiring patterns. A large board is used as the FPC board 20X, and the FPC board 20X is acquired by cutting a large-sized FPC board. Accordingly, when the size is increased, the number of acquired boards is reduced and the cost is increased as much.

The present invention is contrived in view of the aforementioned problems and it is an object of the present invention to provide an electro-optical device in which the degree of freedom in arrangement of wiring patterns on an FPC board is not reduced and increase in size of the FPC board is not required, even when a circuit board is mounted to overlap the FPC board, and an electronic apparatus having the electro-optical device.

SUMMARY

According to an aspect of the present invention for accomplishing the above object, there is provided a mounting structure comprising an FPC board on which a plurality of wires are arranged and which has a first terminal and a circuit board on which electronic components are mounted and which has a second terminal connected to the first terminal, wherein the circuit board is disposed to interest at least a part of the plurality of wires at a surface side of the FPC board at which the plurality of wires are arranged.

According to another aspect of the present invention, there is provided an electro-optical device comprising an electro-optical device substrate which retains an electro-optical material, an FPC board on which a plurality of wires are arranged and which has a first terminal, and a circuit board on which electronic components are mounted and which has a second terminal connected to the first terminal, wherein the circuit board is disposed to interest at least a part of the plurality of wires at a surface side of the FPC board at which the plurality of wires are arranged.

According to the present invention described above, since a plurality of electronic components is mounted on the circuit board such as a glass-epoxy board and then the circuit board is mounted to overlap the FPC board, it is possible to efficiently mount the plurality of electronic components on the circuit board using a reflow soldering method, so that the working efficiency is enhanced in the mounting step. In addition, since the electronic components are integrated on the circuit board, it is enough that spaces for disposing the plurality of electronic components are collectively secured at a position where the circuit board is received when the electro-optical device substrate is fitted into a case, and it is not necessary to secure the spaces for disposing the electronic components at different positions in the case. Furthermore, according to the present invention described above, since wiring patterns can be arranged in the area between the circuit board and the FPC board where the wiring patterns were not arranged, the size of the FPC board can be reduced and the degree of freedom in designing the wiring patterns can be enhanced.

In the present invention, the circuit board may be made of a rigid board such as a glass-epoxy board.

In the present invention, it is preferable that a protrusion portion of which three sides are separated from a main body of the FPC board is formed in the FPC board, the first terminal is provided on the protrusion portion, and the second terminal is provided on an end of the circuit board. According to this structure, it is not necessary to form connection terminals to the circuit board in the area of the main body (a portion other than the protrusion portion in the FPC board) of the FPC board overlapped with the circuit board. Accordingly, the degree of freedom in layout is increased when designing the wiring patterns on the FPC board, and the FPC board requires only a small size.

In the present invention, it is preferable that the first terminal is provided, for example, on the back surface of the protrusion portion opposite to the front surface on which the plurality of wires are arranged, and the second terminal is provided on the front surface of the circuit board on which the electronic components are mounted and is connected to the first terminal in a state where the second terminal enters the back surface side of the protrusion portion.

In the present invention, the first terminal may be provided on the front surface of the protrusion portion on which the plurality of wires are provided, and the second terminal may be provided on the back surface of the circuit board opposite to the front surface on which the electronic components are mounted and may be connected to the first terminal at the front surface side on which the plurality of wires are arranged.

In the present invention, the FPC board may be bent toward the electro-optical device substrate, and the circuit board may be disposed at the bent position of the FPC board. According to the present invention described above, since a narrow and long circuit board can be disposed in the width direction of the FPC board, the circuit board dose not cause any hindrance in arranging the circuit board at the bent position of the FPC board.

In the present invention, it is preferable that the protrusion portion is disposed at the inside of a minimum imaginary rectangular shape including the whole FPC board other than the protrusion portion. According to this structure, when an FPC board having a single product size is cut out from a large-sized board, the number of acquired boards can be increased. Therefore, it is possible to reduce the cost of the FPC board.

In the present invention, the protrusion portion may be protruded, for example, from a punched-out portion formed by punching out the FPC board.

In the present invention, the protrusion portion may be protruded outwardly from the main body of the FPC board.

In the present invention, the protrusion portion may be composed of slits cut out in the FPC board and a side edge of the FPC board.

The electro-optical device according to the present invention can be used as a display unit of an electronic apparatus such as a mobile phone, a mobile computer, etc.

According to another aspect of the present invention, there is provided a method of manufacturing an electro-optical device, the electro-optical device comprising an electro-optical device substrate which retains an electro-optical material, a FPC board on which a plurality of wires are arranged and which has a first terminal, and a circuit board on which electronic components are mounted and which has a second terminal connected to the first terminal, the method comprising a pressing step of pressing the first and second terminals at a pressing area in which the first terminal and the second terminal are formed, wherein the pressing step is performed using a pressing head having a width corresponding to the greatest width of the pressing area.

DETAILED DESCRIPTION

Hereinafter, embodiments of the present invention will be described with reference to the drawings.

First Embodiment

Entire Structure of Electro-Optical Device

Figure 1:
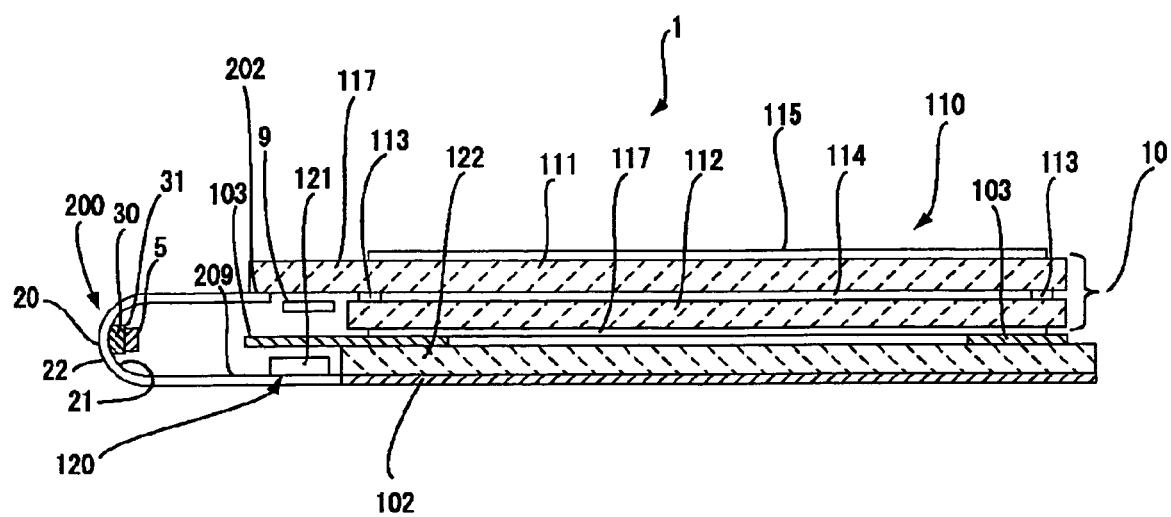
FIG. 1 is a cross-sectional view illustrating an electro-optical device according to the present invention.

FIG. 1 is a cross-sectional view illustrating an electro-optical device according to the present invention. As shown in FIG. 1, the electro-optical device 1 according to the present invention has a liquid crystal module 110, and the liquid crystal module 110 comprises a liquid crystal panel 10, a lower polarizing film 117 disposed at the back surface side of the liquid crystal panel 10, an upper polarizing film 115 disposed at the display surface side of the liquid crystal panel 10, a backlight unit 120, and an FPC board 20 connected to the liquid crystal panel 10. The FPC board 20 has a structure that terminals and wiring patterns are formed on a flexible base member such as a polyimide film. The backlight unit 120 comprises a light waveguide plate 122 disposed at the back surface side of the liquid crystal panel 10 with the lower polarizing film 117 therebetween, a light source 121 emitting light to the side end of the light waveguide plate 122, and a reflecting film 102 disposed at the back surface side of the light waveguide plate 122. A double-sided tape 103 having a light-shielding property is attached to ends on the front surface of the light waveguide plate 112.

The liquid crystal panel 10 comprises an element substrate 111 (an electro-optical device substrate in the present invention) and a counter substrate 112 disposed to oppose the element substrate 111, and the element substrate 111 and the counter substrate 112 are bonded to each other with a seal member 113. In the liquid crystal panel 10, a liquid crystal 144 as an electro-optical material is injected and retained in the area partitioned by the seal member 113 between the element substrate 111 and the counter substrate 112.

The liquid crystal panel 10 is, for example, an active matrix liquid crystal panel using a TFD (Thin Film Diode) as a pixel switching element. Since a well-known panel can be used as the liquid crystal panel 10, detailed description thereof will be omitted. Pixel electrodes, pixel switching TFD elements, data lines, scanning lines, color filters, etc. are formed on the opposing surfaces of the element substrate 111 and the counter substrate 112.

In the liquid crystal panel 10, the seal member 113 includes a plurality of conductive particles having a conductive property and has a function of electrically connecting the wiring patterns formed on the element substrate 111 to the wiring patterns formed on the counter substrate 112. Accordingly, in the present embodiment, the driving IC 9 is mounted only in a stretched area 117 stretched from the outer circumferential edge of the seal member 113 in the element substrate 111, and the FPC board 20 is connected only to an end of the stretched area 117. Therefore, when signals or power is supplied to the driving IC 9 through the FPC board 20, data signals or scanning signals are output from the driving IC 9, thereby controlling the alignment state of the liquid crystal 114 in a unit of pixels. Therefore, the display in a transmission mode can be performed by modulating the light emitted from the backlight unit 120, and the display in a reflection mode can be performed by modulating the external light input from the element substrate 111.

Here, assumed that the surface on which terminals 202 connected to the element substrate 11 are formed is called a back surface 22 (one surface) and the opposite surface thereof is called a front surface 21 (the other surface), the FPC board 20 is bent toward the front surface 21, the free end 209 thereof goes toward the liquid crystal panel 10, and the circuit board 30 is disposed at the inside thereof.

Mounting Structure of Electronic Components

Figure 2:
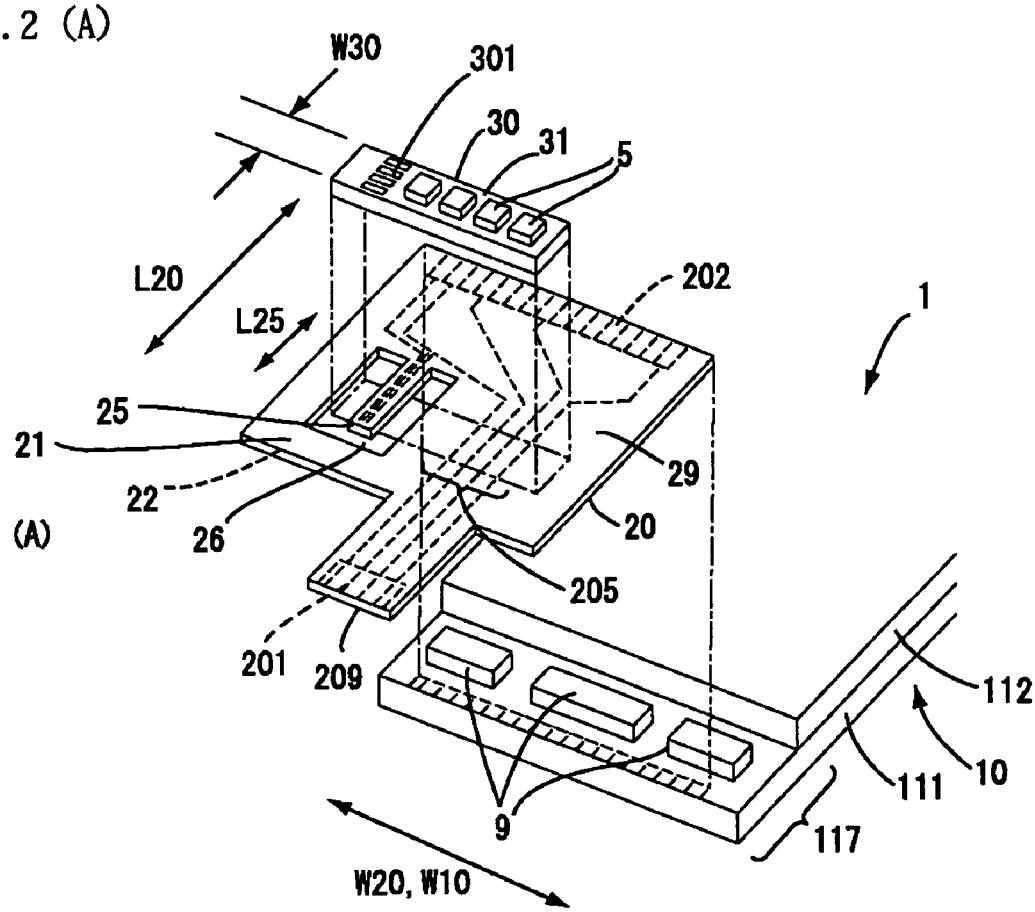
FIGS. 2(A) and 2(B) are explanatory diagrams illustrating an FPC board and a circuit board used in the electro-optical device according to a first embodiment of the present invention.
Figure 2:
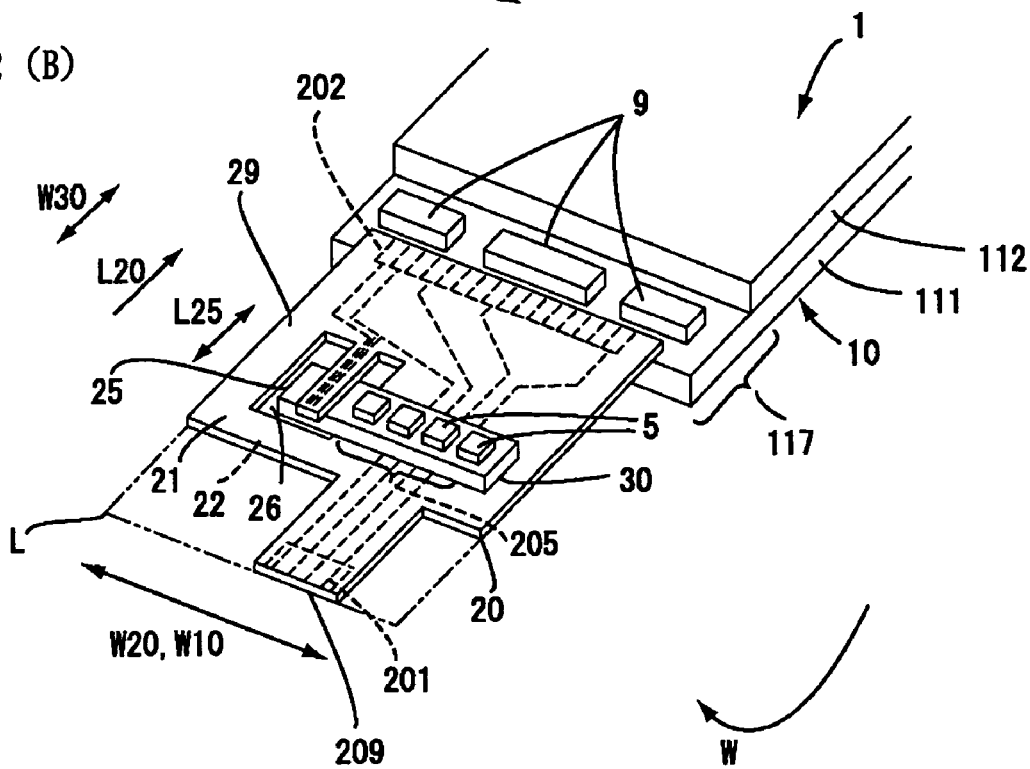

FIGS. 2(A) and 2(B) are explanatory diagrams illustrating the FPC board 20 and the circuit board 30 used in the electro-optical device 1 according to the first embodiment of the present invention. In FIGS. 2(A) and 2(B), the top and the bottom are opposite to those of FIG. 1, and the front surface of the FPC board 20 faces the top.

In the present embodiment, as shown in FIGS. 2(A) and 2(B), terminals 201 connecting the FPC board 20 to external circuits are formed at one end (free end 209) of the back surface 22 of the FPC substrate 20, and terminals 202 connected to the element substrate 111 through an anisotropic conductive material, etc. are formed at the other end thereof.

On the front surface 21 of the FPC board 20, the thin and long rectangular circuit board 30 of which the front surface 31 is mounted with the electronic components 5 such as a power source IC, a control IC, etc. by soldering and which is made of a rigid board such as a glass-epoxy board is disposed.

The circuit board 30 is electrically connected to the FPC board 20. In the present embodiment, when the circuit board 30 is connected to the FPC board 20, a cut-out portion 26 is cut out in a window shape such that a protrusion portion 25 extending the length direction $L_{20}$ of the FPC board 20 is left at the inside of the FPC substrate 20, and terminals (not shown) connected to the terminals 301 formed on the front surface 31 (the same surface as the surface on which the electronic components 5 are mounted) of the circuit board 30 are formed on the back surface 22 (a surface opposite to the surface on which the wiring patterns 205 are formed) of the protrusion portion 25. Therefore, the terminals of the protrusion portion 25 and the terminals of the circuit board 30 are connected to each other through the anisotropic conductive material, etc. in a state where the protrusion portion 25 overlaps the end of the circuit board 30 by allowing the end of the circuit board 30 overlapping the front surface 21 (the entire surface except for the protrusion portion 25) of the main body 29 of the FPC board 20 to enter the back surface 22 side of the protrusion portion 25, so that the circuit board 30 and the FPC board 20 are electrically connected to each other.

Here, the terminals formed on the back surface 22 of the protrusion portion 25 and the terminals 301 formed on the front surface 31 of the circuit board 30 are connected in the state where the end of the circuit board 30 enters the back surface 22 side of the protrusion portion 25. However, if there is no problem in disposing the electronic components or arranging the wires, the terminals formed at an end of the back surface (a surface opposite to the surface on which the electronic components 5 are mounted) of the circuit board 30 and the terminals formed on the front surface 21 (the same surface as the surface on which the wiring patterns 205 are formed) of the protrusion portion 25 may be connected to each other at the front surface 21 side of the FPC board 20.

Here, the plural terminals 301 of the circuit board 30 are arranged, for example, in a line in the width direction $W_{30}$ of the circuit board 30 on the front surface 31 of the circuit board 30, and in the protrusion portion 25 of the FPC board 20, the terminals connected to the terminals 301 of the circuit board 30 are arranged in a line in the length direction $L_{25}$ of the protrusion portion 25. The circuit board 30 is disposed to extend in the direction perpendicular to the length direction $L_{20}$ (the length direction $L_{25}$ of the protrusion portion 25) of the FPC board 20, that is, in the direction parallel to the width direction $W_{20}$ (the width direction $W_{10}$ of the liquid crystal panel 10) of the FPC board 20.

Figure 3:
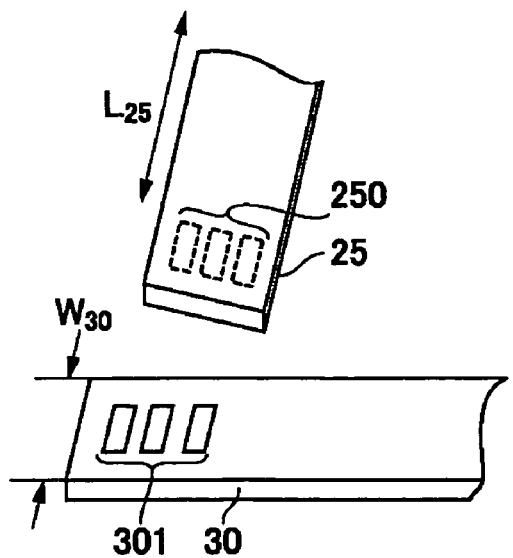
FIGS. 3(A), 3(B), and 3(C) are explanatory diagrams illustrating an FPC board and a circuit board used in the electro-optical device according to a first embodiment of the present invention.
Figure 3:
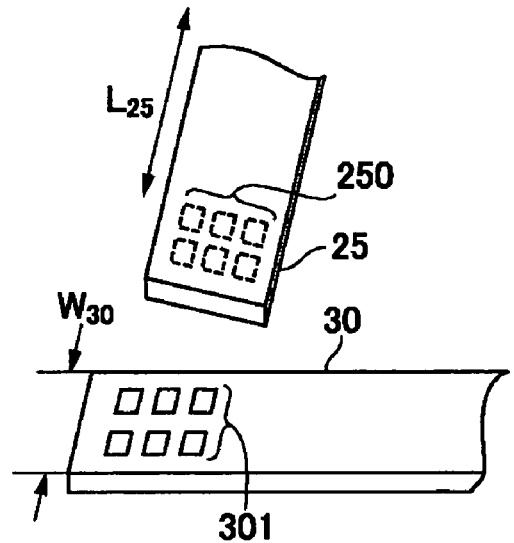
Figure 3:
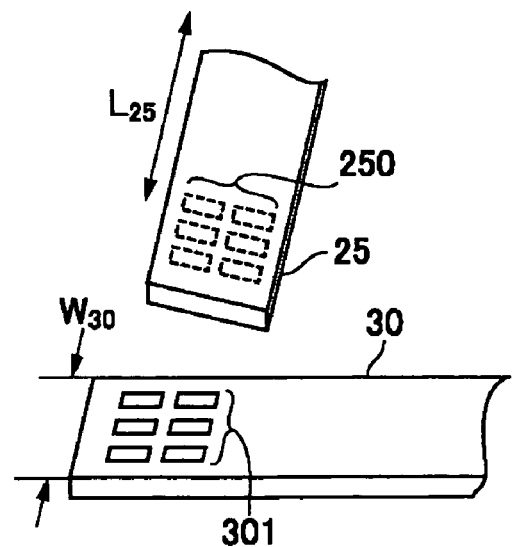

The connection terminals may have the following arrangements: a case where the terminals 301 of the circuit board 30 and the terminals 250 of the FPC board 20 are arranged in a line in the direction crossing the width direction $W_{30}$, as shown in FIG. 3(A); a case where the terminals 301 of the circuit board 30 and the terminals 250 of the FPC board 20 are arranged in two lines in the direction crossing the width direction $W_{30}$, as shown in FIG. 3(B); and the terminals 301 of the circuit board 30 and the terminals 250 of the FPC board 20 are arranged in two lines in the width direction $W_{30}$, as shown in FIG. 3(C).

Method of Manufacturing Electro-Optical Device 1

In manufacturing the electro-optical device 1 having the aforementioned structure, first, a cream solder is printed on a large-sized circuit board from which plural circuit boards 30 having a single product size can be obtained, the electronic components 5 are mounted thereon, and then the large-sized circuit board is allowed to pass through a reflow furnace. Then, by cutting the large-sized circuit board, the circuit boards 30 having the single product size are obtained.

Next, the circuit board 30 is mounted on the FPC board 20 through an anisotropic conductive material, and the FPC board 20 is fitted to the liquid crystal panel 10 through the anisotropic conductive material, etc. Alternatively, the FPC board 20 before the circuit board 30 is mounted on the FPC board 20 through the anisotropic conductive material, etc. is first fitted to the liquid crystal panel 10 through the anisotropic conductive material, etc., and then the circuit board 30 is mounted on the FPC board 20 through the anisotropic conductive material, etc. In any case, the first terminals which are disposed on the FPC board 20 and are connected to the terminals 301 of the circuit board 30 and the second terminals 301 which are arranged on the circuit board 30 and are connected to the first terminals are electrically connected to each other by the pressing with a pressing head. In the pressing step, it is preferable that the pressing is performed using the pressing head having a width corresponding to the greatest width of the pressing area in which the first terminals and the second terminals are formed and which needs to be pressed to electrically connect the first terminals and the second terminals. That is, considering positional deviation at the time of pressing, the width of the pressing head is set slightly greater than the greatest width of the pressing area, and the width is set to the minimum necessary value. By using the aforementioned method, the wiring patterns 205 of the FPC board 20 cannot be damaged due to the pressing.

Next, the FPC board 20 connected to the liquid crystal panel 10 is fitted into a case, etc., in a state where the FPC board is bent toward the front surface 21 as indicated by the arrow W. As a result, the circuit board 30 is disposed at the inside of the bent portion 200 of the FPC board 20 (see FIG. 1).

Main Advantages of First Embodiment

As described above, in the present embodiment, a plurality of electronic components 5 are integrally mounted on the circuit board 30, and the circuit board 30 is then connected to the FPC board 20. Only if the electronic components 5 can be mounted on the circuit board 30, any efficient mount method such as a reflow soldering method, etc. can be used. As a result, since the minimum necessary number of electronic components can be mounted on the FPC board 20, the working efficiency is high in the mounting step.

Since the electronic components 5 are integrated on the circuit board 30, the electronic components 5 can be collectively received in the position for receiving the circuit board 30 when the liquid crystal panel 10 or the electro-optical device 1 (the liquid crystal module 110) coupled to the FPC substrate 20 is fitted into the case, so that the dead space can be reduced compared with the case where the electronic components 5 are received in several positions of the case.

When the circuit board 30 is connected to the FPC board 20, the protrusion portion 25 extending in the length direction $L_{20}$ of the FPC board 20 is formed in the FPC board 20 and the circuit board 30 is connected to the FPC board so as to cross the protrusion portion 25 (so as to perpendicularly cross the protrusion portion in the present embodiment). As a result, unlike the case where the circuit board 30 is directly mounted on the FPC board 20, it is not necessary to arrange terminals on the back surface 22 of the FPC board 20 in the entire area overlapping the circuit board 30.

In the present embodiment, in order to bend the FPC board 20, the circuit board 30 having a small width is disposed such that the length direction thereof is perpendicular to the extending direction of the protrusion portion 25 (parallel to the width direction of the FPC board 20). However, since the circuit board is connected to the protrusion portion, plural terminals for connection to the circuit board 30 are not necessarily arranged on the front surface 21 of the FPC board 20 along the width direction $W_{20}$ of the FPC board 20. Therefore, since the wiring patterns 205 can pass through the area of the front surface 21 of the FPC board 20 overlapping the circuit board 30, the degree of freedom in arrangement of the wiring patterns 205 is great. As a result, since a large-sized board need not be used as the FPC board 20, it is possible to reduce the cost for the FPC board 20.

In the present embodiment, the cut-out portion 26 is formed in a window shape at the inside of the FPC board 20 to form the protrusion portion 25. Accordingly, when the minimum imaginary rectangular shape is drawn to include the whole main body 29 except for the protrusion portion 25 of the FPC board 20 as indicated by the two-dot dashed line of FIG. 2(B), the protrusion portion 25 is formed at the inside of the rectangular shape. That is, the protrusion portion 25 is not protruded outwardly from the main body 29. Therefore, when the FPC board 20 is cut out from a large-sized FPC board, the number of acquired boards is not reduced due to the formation of the protrusion portion 25 in the FPC board 20. As a result, it is possible to reduce the cost for the FPC board 20.

Second Embodiment

Figure 4:
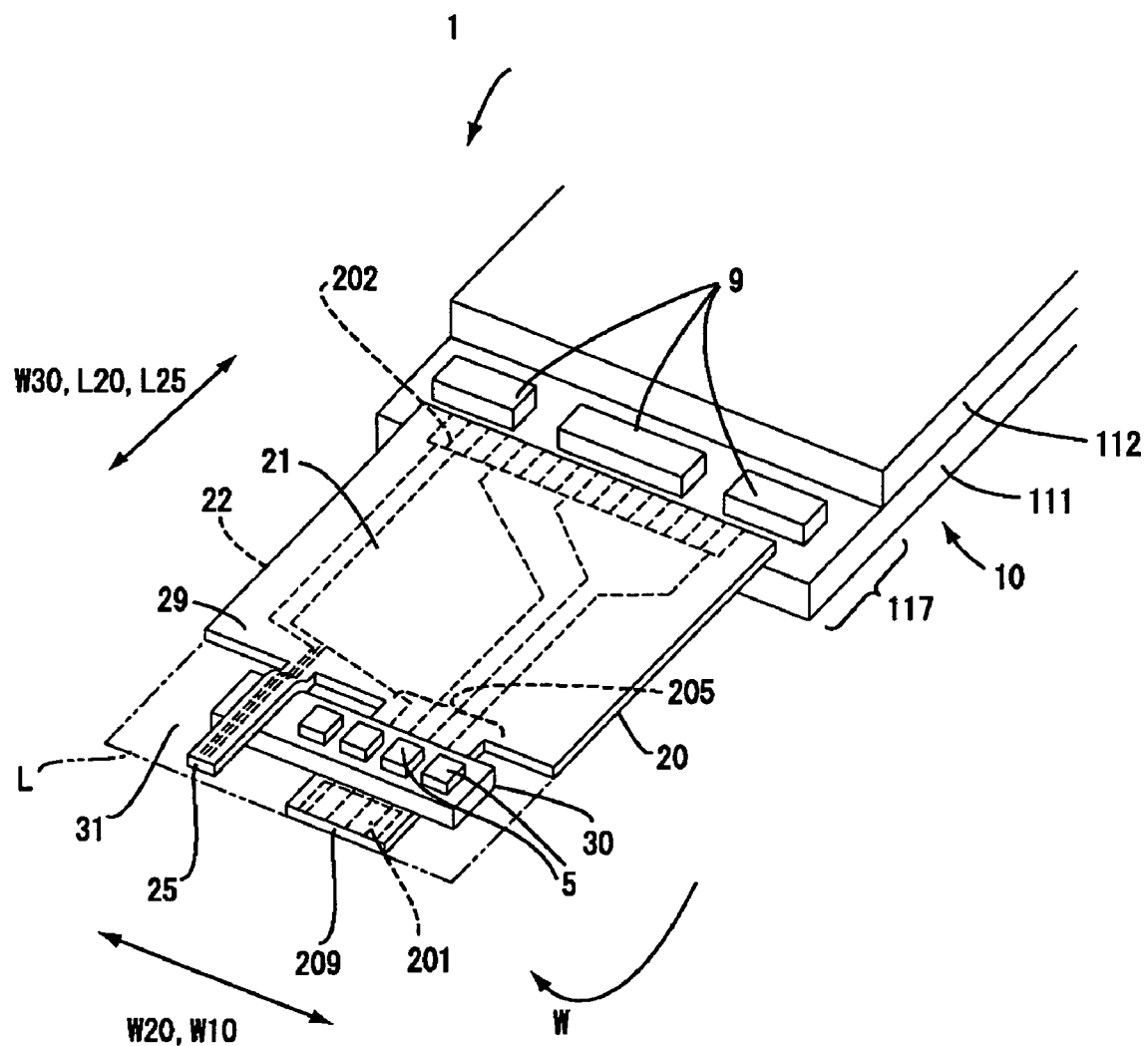
FIG. 4 is an explanatory diagram illustrating an FPC board and a circuit board used in the electro-optical device according to a second embodiment of the present invention.

FIG. 4 is an explanatory diagram illustrating an FPC board and a circuit board used in the electro-optical device according to a second embodiment of the present embodiment. Since the basic structure of the electro-optical device according to the present invention is similar to that of the first embodiment, the common elements are denoted by the same reference numerals and description thereof will be omitted.

As shown in FIG. 4, in the present embodiment, similarly to the first embodiment, terminals 201 for connecting an FPC board 20 and external circuits are formed at one end (free end 209), for example, of the back surface 22 of the FPC board 20, and terminals 202 for connection to an element substrate 111 are formed at the other end thereof. A narrow and long rectangular circuit board 30 of which the front surface 31 is mounted with electronic components 5 such as a power source IC, a control IC, etc. by soldering and which is made of a rigid board such as a glass-epoxy board is disposed on the front surface 21 of the FPC board 20.

In the present embodiment, a protrusion portion 25 extending in the length direction $L_{20}$ outwardly from the main body 29 is formed at a circumferential edge of the FPC board 20, and terminals (not shown) connected to the terminals formed on the front surface 31 of the circuit board 30 are formed on the back surface 22 (a surface opposite to the surface on which the wiring patterns 205 are formed) of the protrusion portion 25. In the present embodiment, similarly to the first embodiment, when the minimum imaginary rectangular shape is drawn to include the whole main body 29 except for the protrusion portion 25 of the FPC board 20 as indicated by the two-dot dashed line of FIG. 4, the protrusion portion 25 is formed at the inside of the rectangular shape. Therefore, when the FPC board 20 is cut out from a large-sized FPC board, the number of acquired boards is not reduced due to the formation of the protrusion portion 25 in the FPC board 20, so that it is possible to reduce the cost for the FPC board 20.

When the circuit board 30 is mounted on the FPC board 20 having the aforementioned structure, in the present embodiment, similarly to the first embodiment, the terminals of the protrusion portion 25 and the terminals of the circuit board 30 are connected to each other through the anisotropic conductive material, etc. in a state where the protrusion portion 25 overlaps the end of the circuit board 30 by allowing the end of the circuit board 30 overlapping the front surface 21 of the main body 29 (the entire portion except for the protrusion portion 25) to enter the back surface 22 side of the protrusion portion 25, thereby electrically connecting the circuit board 30 to the FPC board 20. Here, the circuit board 30 is disposed to extend in the direction perpendicular to the length direction $L_{20}$ (the length direction $L_{25}$ of the protrusion portion 25) of the FPC board 20, that is, in the direction parallel to the width direction $W_{20}$ (the width direction $W_{10}$ of the liquid crystal panel 10) of the FPC board 20.

If there is no problem in disposing the electronic components or arranging the wires, the terminals formed at an end of the back surface (a surface opposite to the surface on which the electronic components 5 are mounted) of the circuit board 30 and the terminals formed on the front surface 21 of the protrusion portion 25 may be connected to each other at the front surface 21 (the same surface as the surface on which the wiring patterns 205 are formed) side of the FPC board 20.

In the electro-optical device 1 having the aforementioned structure, since the electronic components 5 can be mounted on the circuit board 30 using the reflow soldering method, the working efficiency is great in the mounting step. In addition, since the wiring patterns 205 can pass through the area of the front surface 21 of the FPC board 20 overlapping the circuit board 30, it is possible to obtain the same advantage as the first embodiment, such as decrease in size of the FPC board 20, etc.

Third Embodiment

Figure 5:
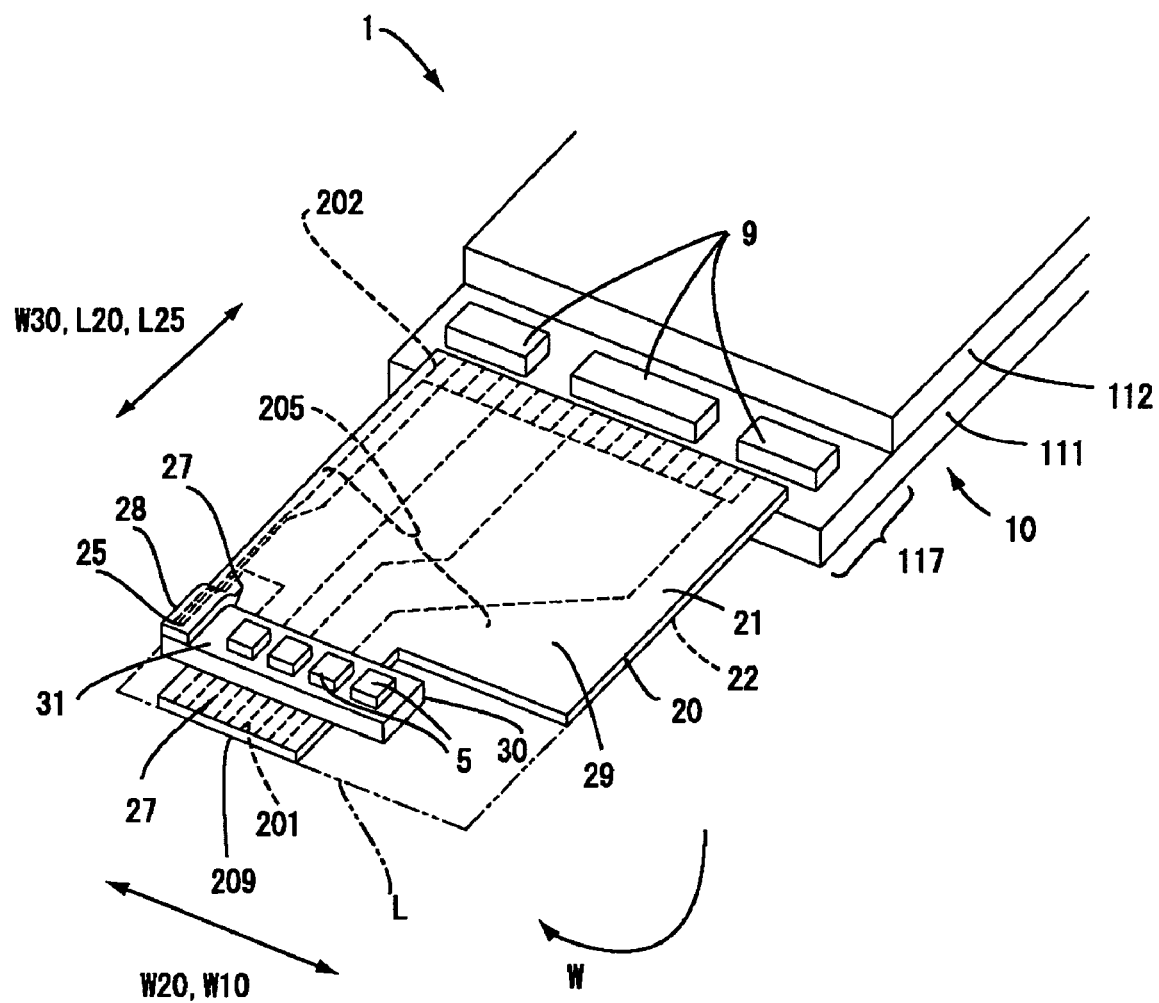
FIG. 5 is an explanatory diagram illustrating an FPC board and a circuit board used in an electro-optical device according to a third embodiment of the present invention.
Figure 6:
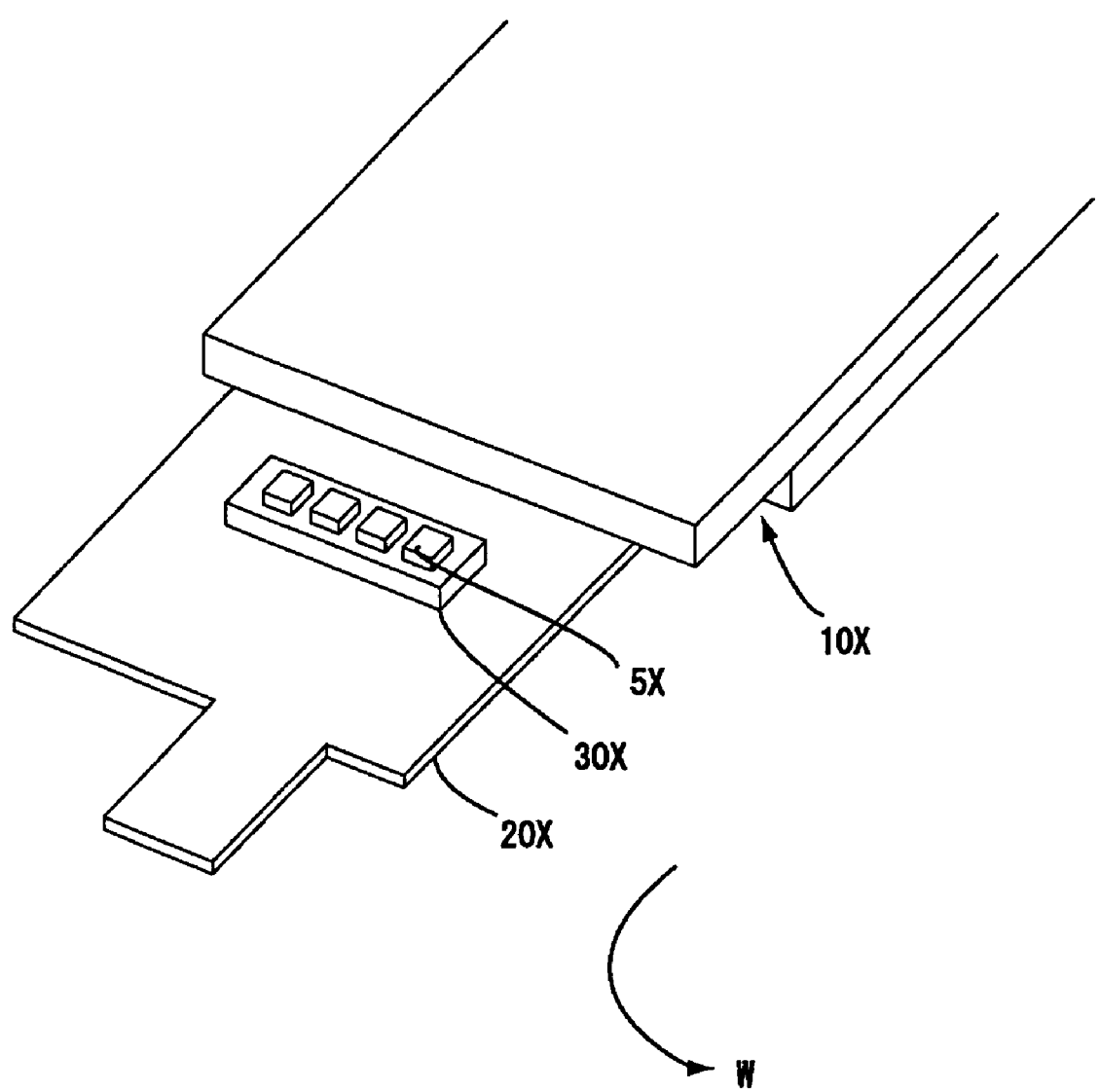
FIG. 6 is an explanatory diagram illustrating a conventional electro-optical device.

FIG. 5 is an explanatory diagram illustrating an FPC board and a circuit board used in the electro-optical device according to a third embodiment of the present invention. Since the basic structure of the electro-optical device according to the present embodiment is similar to that of the first embodiment, the common elements are denoted by the same reference numerals and description thereof will be omitted.

As shown in FIG. 5, in the present embodiment, similarly to the first embodiment, terminals 201 for connecting an FPC board 20 and external circuits are formed at one end (a free end 209), for example, of the back surface 22 of the FPC board 20, and terminals 202 for connection to an element substrate 111 are formed at the other end thereof. A narrow and long rectangular circuit board 30 of which the front surface 31 is mounted with electronic components 5 such as a power source IC, a control IC, etc. by soldering and which is made of a rigid board such as a glass-epoxy board is disposed on the front surface 21 of the FPC board 20.

In the present embodiment, a protrusion portion 25 extending in the length direction $L_{20}$ is formed at a corner portion of the FPC board 20, where the protrusion potion is composed of a slit 27 formed in the direction perpendicular to the arrangement direction (the width direction $W_{20}$ of the FPC board 20) of the terminals 202 from the free end 209 of the FPC board 20 and a side edge 28 of the FPC board 20. Terminals (not shown) connected to the terminals formed on the front surface 31 of the circuit board 30 are formed on the back surface 22 (a surface opposite to the surface on which the wiring patterns 205 are formed) of the protrusion portion 25. In the present embodiment, when the minimum imaginary rectangular shape is drawn to include the whole main body 29 except for the protrusion portion 25 of the FPC board 20 as indicated by the two-dot dashed line of FIG. 5, the protrusion portion 25 is formed at the inside of the rectangular shape. Therefore, when the FPC board 20 is cut out from a large-sized FPC board, the number of acquired boards is not reduced due to the formation of the protrusion portion 25 in the FPC board 20, so that it is possible to prevent increase of the cost for the FPC board 20.

When the circuit board 30 is mounted on the FPC board 20 having the aforementioned structure, in the present embodiment, similarly to the first embodiment, the terminals of the protrusion portion 25 and the terminals of the circuit board 30 are connected to each other through an anisotropic conductive material, etc. in a state where the protrusion portion 25 overlaps the end of the circuit board 30 by allowing the end of the circuit board 30 overlapping the front surface 21 of the main body 29 (the entire portion except for the protrusion portion 25) to enter the back surface 22 side of the protrusion portion 25, thereby electrically connecting the circuit board 30 to the FPC board 20. Here, the circuit board 30 is disposed to extend in the direction perpendicular to the length direction $L_{20}$ (the length direction $L_{25}$ of the protrusion portion 25) of the FPC board 20, that is, in the direction parallel to the width direction $W_{20}$ (the width direction $W_{10}$ of the liquid crystal panel 10) of the FPC board 20.

If there is no problem in disposing the electronic components or arranging the wires, the terminals formed at the end of the back surface (a surface opposite to the surface on which the electronic components 5 are mounted) of the circuit board 30 and the terminals formed on the front surface 21 of the protrusion portion 25 may be connected to each other at the front surface 21 (the same surface as the surface on which the wiring patterns 205 are formed) side of the FPC board 20.

In the electro-optical device 1 having the aforementioned structure, since the electronic components 5 can be mounted on the circuit board 30 using the reflow soldering method, the working efficiency is great in the mounting step. In addition, since the wiring patterns 205 can pass through the area of the front surface 21 of the FPC board 20 overlapping the circuit board 30, it is possible to obtain the same advantage as the first embodiment, such as decrease in size of the FPC board 20, etc.

Other Embodiments

In the embodiments described above, the second terminals 301 disposed on the circuit board 30 and connected to the terminals on the FPC board 20 are provided at the end of the circuit board, but only if the circuit board 30 and the wiring patterns of the FPC board 20 cross each other, the position at which the second terminals should be disposed is not limited to the end of the circuit board 30. For example, the second terminals 301 may be provided at both ends of the circuit board 30 and the circuit board 30 and the wiring patterns 205 may cross each other in the area between the terminals. The second terminals 301 may be provided at the center of the circuit board 30 and the circuit board 30 and the wiring patterns 205 may cross each other in both sides of the second terminals 301. According to these structures, the degree of freedom in arrangement of the wiring patterns 205 is enhanced.

In the embodiments described above, the protrusion portion 25 is formed in the FPC board 20. When the first terminals of the FPC board 20 and the second terminals of the circuit board 30 are compressed, a disadvantage that it is difficult to position them can occur. Accordingly, the protrusion portion is formed in order to solve the disadvantage. Therefore, if such a disadvantage does not occur, the circuit board 30 may be mounted on the FPC board 20 not having the protrusion portion 25. According to this structure, since the degree of freedom in arrangement of the wiring patterns 205 can be enhanced without forming the protrusion portion 25 in the FPC board 20, it is advantageous for the manufacturing thereof.

In the aforementioned embodiments, it has been exemplified that the present invention is applied to the active matrix liquid crystal display device using a TFD. However, the present invention may be applied to an active matrix liquid crystal display device using a TFT as a non-linear element or a passive matrix liquid crystal display device.

In addition to the liquid crystal display device, the present invention may be applied to various electro-optical devices such as an electroluminescence display device, a plasma display device, a field emission display (FED) device, a light-emitting diode (LED) display device, an electrophoresis display device, a small-sized television employing a thin brown tube, a liquid crystal shutter, a device employing a digital micro mirror device (DMD), and the like.

Mounting Example on Electronic Apparatus

The electro-optical device according to the present invention can be used as a display unit of various electronic apparatuses such as a mobile phone or a mobile computer.

What is claimed is:

1. An electro-optical device comprising:
an electro-optical device substrate retaining an electro-optical material;
a flexible printed circuit board having a plurality of wires and a first terminal, the wires extending continuously from one edge of the flexible printed circuit board to the other, the flexible printed circuit board having an outer peripheral edge extending around the flexible printed circuit board; and
a circuit board having an electronic component and a second terminal connected to the first terminal;
wherein the circuit board is disposed at a side of the flexible printed circuit board on which the plurality of wires are arranged and is positioned completely within the outer periphery of the flexible printed circuit board in plan view and intersects at least a part of the plurality of wires, the flexible printed circuit board having a protrusion portion inside a window, the printed circuit board being sandwiched between the bottom of the protrusion portion and the top of the flexible printed circuit board.

2. The electro-optical device according to claim 1, wherein the flexible printed circuit board has a protrusion portion separated three sides from a main body of the flexible printed circuit board, wherein the first terminal is provided on the protrusion portion, and
wherein the second terminal is provided on an end of the circuit board.

3. The electro-optical device according to claim 2, wherein the first terminal is provided on an opposite side of the protrusion portion which opposite to a side on which the plurality of wires are arranged, and
wherein the second terminal is provided on a side of the circuit board on which the electronic components are mounted, and is connected to the first terminal in a state of the second terminal hides under the opposite side of the protrusion portion.

4. The electro-optical device according to claim 2, wherein the first terminal is provided on a side of the protrusion portion on which the plurality of wires are provided, and
wherein the second terminal is provided on a opposite side of the circuit board opposite to a side on which the electronic components are mounted, and is connected to the first terminal at the side on which the plurality of wires are arranged.

5. The electro-optical device according to claim 2, wherein the protrusion portion is disposed at the inside of a minimum imaginary rectangular shape including the whole flexible printed circuit board other than the protrusion portion.

6. The electro-optical device according to claim 2, wherein the protrusion portion is protruded from a punched-out portion formed by punching out the flexible printed circuit board.

* * * * *